(12) United States Patent
Madsen et al.

(10) Patent No.: US 6,174,205 B1
(45) Date of Patent: Jan. 16, 2001

(54) COMMUNICATION CARD EXTENSION AND ADAPTER PORT

(75) Inventors: Brent D. Madsen, Providence; Timothy W. Aldridge, Sandy, both of UT (US)

(73) Assignee: 3Com Corporation, Santa Clara, CA (US)

(*) Notice: Under 35 U.S.C. 154(b), the term of this patent shall be extended for 0 days.

(21) Appl. No.: 09/322,869

(22) Filed: May 28, 1999

(51) Int. Cl.⁷ .................... H01R 25/00; H01R 27/02; H01R 31/00; H01R 33/88; H01R 33/90

(52) U.S. Cl. .................... 439/638; 439/946

(58) Field of Search .................... 439/638, 131, 439/946

(56) References Cited

U.S. PATENT DOCUMENTS

| | | | |
|---|---|---|---|
| 4,186,988 | 2/1980 | Kobler | 439/676 |
| 4,241,974 | 12/1980 | Hardesty | 439/638 |
| 4,303,296 | 12/1981 | Spaulding | 439/189 |

(List continued on next page.)

OTHER PUBLICATIONS

Bluetooth–Document Page, "Radio," www. bluetooth.com/document/default.asp? page=radio, p. 1 (date unknown).

Bluetooth–Document Page, "Baseband," www. bluetooth.com/document/default.asp? page=baseband, p. 1–3 (date unknown).

Bluetooth–Document Page, "Link Management," www.bluetooth.com/document/default.asp? page=lm, p. 1 (date unknown).

Bluetooth–Document Page, "Software Framework," www.bluetooth.com/document/default.asp? page=swfw, p. 1 (date unknown).

Bluetooth–Document Page, "PC General," www. bluetooth.com/document/default.asp? page=pc, p. 1 (date unknown).

Bluetooth–Document Page, "Telephone," www. bluetooth.com/document/default.asp? page=phone, p. 1 (date unknown).

Bluetooth–FAQ "General," www.bluetooth.com/faq/default.asp, p. 1–2 (date unknown).

Andrew Till, "Bluetooth Expands Wireless Data Appeal," Computer Dealer News, vol. 15, No. 6, pp. 1–2 (Feb. 12, 1999).

Krypton Isolation's Product, www.krypton–iso.com/P–AboutUs.htm, 1 page (1998).

Primary Examiner—Khiem Nguyen
Assistant Examiner—Hae Moon Hyeon
(74) Attorney, Agent, or Firm—Workman, Nydegger & Seeley

(57) ABSTRACT

The present invention is an adaptor module that allows an electrical connection to be established between a communication system and a communication card. Advantageously, the adaptor module can be configured to provide an interface between the communication card and various communication systems, such as conventional telephone systems, cellular telephone systems, digital telephone systems, local area networks (LANs), personal area networks (PANs), wireless systems, etc. Additionally, the adaptor module can provide an interface between a plurality of communication systems and the communication card. For example, the adaptor module may provide an interface for a plurality of connectors from the same type of communication system and/or the adaptor module may provide an interface for connectors from different types of communication systems. Advantageously, the adaptor module can provide simultaneous communication with these various communication systems. The adaptor module is preferably configured to be attached to a standard PCMCIA card to facilitate communication between a computer and a communication system.

22 Claims, 6 Drawing Sheets

U.S. PATENT DOCUMENTS

| | | | |
|---|---|---|---|
| 4,352,492 | 10/1982 | Smith | 361/415 |
| 4,428,636 | 1/1984 | Kam et al. | 439/404 |
| 4,710,136 | 12/1987 | Suzuki | 439/374 |
| 4,778,410 | 10/1988 | Tanaka | 439/676 |
| 4,915,648 | 4/1990 | Takase et al. | 439/490 |
| 5,139,439 | 8/1992 | Shie | 439/359 |
| 5,183,404 * | 2/1993 | Aldous et al. | 439/55 |
| 5,184,282 | 2/1993 | Kaneda et al. | 361/395 |
| 5,336,099 | 8/1994 | Aldous et al. | 439/131 |
| 5,338,210 | 8/1994 | Beckham et al. | 439/131 |
| 5,391,083 * | 2/1995 | Roebuck et al. | 439/638 |
| 5,391,094 * | 2/1995 | Kakinoki et al. | 439/638 |
| 5,411,405 | 5/1995 | McDaniels | 439/131 |
| 5,457,601 * | 10/1995 | Georgopulos et al. | 361/686 |
| 5,481,616 | 1/1996 | Freadman | 381/90 |
| 5,499,923 | 3/1996 | Archibald | 439/26 |
| 5,505,633 | 4/1996 | Broadbent | 439/329 |
| 5,509,811 * | 4/1996 | Homic | 439/55 |
| 5,513,074 * | 4/1996 | Ainsbury et al. | 361/737 |
| 5,538,442 | 7/1996 | Okada | 439/676 |
| 5,547,401 | 8/1996 | Aldous et al. | 439/676 |
| 5,561,727 | 10/1996 | Akita et al. | 385/88 |
| 5,562,504 | 10/1996 | Moshayedi | 439/638 |
| 5,567,537 | 10/1996 | Yoshizawa | 428/692 |
| 5,606,594 | 2/1997 | Register et al. | 379/58 |
| 5,608,607 * | 3/1997 | Dittmer | 361/686 |
| 5,634,802 | 6/1997 | Kerklaan | 439/131 |
| 5,646,635 | 7/1997 | Cockson et al. | 343/702 |
| 5,655,143 | 8/1997 | Alpert et al. | 361/600 |
| 5,660,568 | 8/1997 | Moshayedi | 439/654 |
| 5,679,013 | 10/1997 | Matsunaga | 439/144 |
| 5,684,672 | 11/1997 | Karidis et al. | 361/683 |
| 5,727,972 | 3/1998 | Aldous et al. | 439/655 |
| 5,739,791 | 4/1998 | Barefield et al. | 343/702 |
| 5,748,443 * | 5/1998 | Flint et al. | 361/686 |
| 5,752,857 * | 5/1998 | Knights | 439/638 |
| 5,773,332 * | 6/1998 | Glad | 439/344 |
| 5,797,771 | 8/1998 | Garside | 439/610 |
| 5,816,832 | 10/1998 | Aldous et al. | 439/131 |
| 5,820,414 * | 10/1998 | Omori | 439/638 |
| 5,821,907 | 10/1998 | Zhu et al. | 343/906 |
| 5,828,341 | 10/1998 | Delamater | 343/702 |
| 5,828,346 | 10/1998 | Park | 343/826 |
| 5,846,092 | 12/1998 | Feldman et al. | 439/76.1 |
| 5,867,131 | 2/1999 | Camp, Jr. et al. | 343/797 |
| 5,877,565 | 3/1999 | Hollenbach | 307/119 |
| 5,896,574 | 4/1999 | Bass, Sr. | 455/557 |
| 5,898,920 | 4/1999 | Jacobs | 455/422 |

* cited by examiner

COMMUNICATION CARD EXTENSION AND ADAPTER PORT

BACKGROUND OF THE INVENTION

1. Field of the Invention

The present invention generally relates to electrical connectors and, in particular, to connectors for electrically coupling communication equipment to electrical devices.

2. Description of Related Art

Electrical devices, such as personal computers (PCs), laptop computers, portable computers, notebook computers, palmtop computers, cellular telephones, personal information managers (PIMs) and personal data assistants (PDAs), are becoming increasingly dependent upon their ability to electrically communicate or share information with other electrical devices. To facilitate this electrical communication, a variety of different types of electrical couplers have been developed. In general, these electrical couplers include a plug and a corresponding jack. The jack typically includes an aperture or socket and when the plug is inserted into the jack, an electrical connection is established.

These known electrical couplers are frequently designed for use with devices such as cards that are made in accordance with standards established by the Personal Computer Memory Card International Association (PCMCIA). These cards, often referred to as PC cards, can be designed to perform a variety of different functions and a circuit board located within the card provides the necessary circuitry to perform the intended function. For example, the PC card may allow the device to receive and transmit information over the telephone lines. Alternatively, the PC card may allow the device to receive and transmit information over a network system such as a local area network (LAN).

PC cards have become increasingly used in portable computers because the cards are ready interchangeable and they have a small size. Additionally, PC cards are very popular because they allow a user to relatively quickly and easily link a computer to a modem and obtain information and data from a remote computer. Thus, users can transmit and receive data from various locations, such as at home, during business meetings, on vacation, while traveling, in satellite offices, etc.

In general, PC cards have a thin, elongated structure which is inserted into an opening or slot in the body of a computer. The PC cards have a connector at one end which is configured to be coupled to the computer and the other end of the card has a connector configured to be coupled to communication equipment such as a telephone line. Typically, a standard RJ-11 telephone jack is used to connect a telephone line to the PC card. These PC cards are typically designed to be readily connected or removed from the electrical device.

In greater detail, as shown in FIG. 1, a conventional adaptor assembly 10 connects a telephone line 12 to a portable computer 14. In greater detail, the adaptor assembly 10 includes an electrical connector plug 16 that is inserted into an input/output (I/O) connector 18 of a PC card 20 and a line 22 that connects an external module 24 to the connector plug 16. The external module 24 includes a housing 26 with an aperture 28 configured to receive an RJ-11 type telephone jack 30 connected to the telephone line 12. Disposed within the PC card is a printed circuit board (PCB) that provides the necessary circuitry to perform the intended function of the PC card.

Disadvantageously, the adaptor assembly 10 is awkward to use because it requires the use of both the PC card 20 and the separate structure including the plug 16, line 22 and module 24 (often referred to as the "dongle"). The dongle is required for connecting the adaptor assembly 10 to the telephone line 12 and if it is lost, misplaced or damaged by the user, the connection to the telephone line cannot be established. If the dongle is lost or damaged, this results in unnecessary delay and expense because a new dongle must be purchased or the damage dongle repaired. Additionally, because the dongle is separate from the PC card, it requires additional space and it is susceptible to being dislodged from the computer. Further, the dongle is aesthetically displeasing and it is subject to being damaged or broken because it is a separate component that is external to the computer.

Another conventional jack used for connecting a PC card to a telephone line is disclosed in U.S. Pat. No. 5,183,404 issued to Aldous, et al. and assigned to the same assignee as the present application. The Aldous patent, which is hereby incorporated by reference in its entirety, discloses a PC card 32 with a slidable thin plate 34. The plate 34 includes an aperture 36 adapted to receive a telephone jack and a plurality of short contact pins are rigidly mounted to the thin plate. Each contact pin has a first end that is freely exposed within the aperture and an opposed second end mounted to the plate. A flexible wire ribbon has a first end that is soldered to the second end of the contact pins and an opposing second end that is soldered to contacts on the circuit board within the PC card. The thin plate 34 can selectively slide between an extended position and a retracted position. In the extended position, as shown in FIG. 2, the aperture 36 is exposed such that an RJ-11 telephone plug can be inserted. The plug pushes against the contact pins to establish electrical communication between the plug, contact pins, flexible wire ribbon and the PC card. When not in use, the thin plate 34 is retracted within the PC card 32 and the aperture 36 is not exposed.

As shown in FIG. 3, another known device used to attach a standard telephone jack to a PC card is disclosed in co-pending U.S. patent application Ser. No. 09/271,620, filed Mar. 17, 1999, listing Oliphant et al. as inventors and assigned to the same assignee as the present application. The Oliphant application discloses a PC card 40 that includes a physical/electrical modular connector 42 which is configured to physically and electrically couple a media plug, such as RJ-11 standard telephone jack, to the PC card. More specifically, the jack is mounted to a slide plate that is movable between an extended position wherein an aperture configured to receive a telephone jack is exposed and a retracted position wherein the slide plate is positioned within an opening in the PC card. The jack includes a number of pins which are configured to be electrically connected to a plug inserted into the opening. The pins are electrically connected to the PC card when the jack is in the extended position and the pins are insulated from electrical communication with the PC card when the jack is in the retracted position.

Another conventional device used to connect a PC card to a telephone line is disclosed in U.S. Pat. No. 5,509,811 issued to Homic. The Homic patent discloses an RJ-11 telephone socket that is physically and electrically connected to a PCMCIA modem card that it is recessed a predetermined distance "X" within the computer housing. The telephone socket and the modem card are mechanically and physically connected by a connector block. The connector block includes a body portion that is mounted flush to the exterior surface of the computer enclosure. The connector also includes an end cap that protrudes downwardly and outwardly from the body portion. The end cap has a thickness "X" that is the same as the predetermined distance "X" that the modem card is recessed into the computer so that the exterior surface of the modem card is flush with the outer surface of the computer housing. Disadvantageously, this device requires that the modem card be recessed a predetermined distance "X" inside the body of the computer and it allows only RJ-11 telephone jacks to be connected to the modem card. Thus, the modem assembly cannot be coupled to other communication systems. Additionally, because the RJ-11 telephone socket is integrally connected to the modem card and both the PC card and the connector block are recessed inside the computer, the socket is not readily replaceable, interchangeable or repairable.

Another conventional device is disclosed in U.S. Pat. No. 5,608,607 issued to Dittmer. The Dittmer patent discloses a PCMCIA card structure this is inserted into a dual PCMCIA card slot. The structure includes an attachment section that is removably connected to the PCMCIA card and a support body that is secured to the attachment section. The attachment section has a shape similar to the PCMCIA card and this section is positioned in a parallel, facing and closely adjacent relationship with the PCMCIA card. The attachment section forms an electrical interface connection between the PCMCIA card and an external device or system. The Dittmer patent, however, only provides socket openings in the attachment section for a standard RJ-11 telephone jack and a standard cellular telephone connector plug. Thus, because the device can only be connected by standard plugs to a conventional telephone system and a cellular telephone system, its usefulness is limited.

SUMMARY OF THE INVENTION

A need therefore exists for an adaptor module that provides an interface between a connector and a communication card without the above-described disadvantages and problems.

One aspect of the present invention is an adaptor module that allows an electrical connection to be established between a communication system and a communication card. Advantageously, the adaptor module can be configured to provide an interface between the communication card and various communication systems, such as conventional telephone systems, cellular telephone systems, digital telephone systems, local area networks (LANs), personal area networks (PANs), wireless systems, etc.

Another aspect is the adaptor module can provide an interface between a plurality of communication systems and the communication card. For example, the adaptor module may provide an interface for a plurality of connectors from the same type of communication system and/or the adaptor module may provide an interface for connectors from different types of communication systems. Advantageously, the adaptor module can provide simultaneous communication with these various communication systems.

Yet another aspect is the adaptor module includes one or more RJ-type connectors, multiple pin interfaces and/or universal serial buses (USBs) to allow communication with various communication systems to be established. These RJ-type connectors, for example, may include standard RJ-11 or RJ-45 jacks that are conventionally used for modem and network communications, respectively. The multiple pin interfaces may include any number of desired pins, such as 15, 26 or 34 pins. Significantly, these interfaces and connectors are easy to use and provide a stable attachment mechanism.

Still another aspect of the adaptor module is it provides an interface for use with electronic devices such as personal computers (PCs), portable computers, laptop computers, notebook computers and palmtop computers. The adaptor module can also be used with electronic devices such as cellular telephones, personal data assistants (PDAs), personal information managers (PIMs) and the like.

Another aspect of the adaptor module is it is readily connectable to a standard PCMCIA or PC card. The adaptor module is also quickly and easily detachable from the PC card. Advantageously, this allows one adaptor module to be readily interchangeable with another adaptor module. This allows different adaptor modules with different configurations to be connected to the PC card so that the same PC card can be connected to numerous communication systems. Significantly, because the adaptor modules are interchangeable, this allows the modules to be easily repaired or replaced.

Yet another aspect of the adaptor module is that it includes a plurality of sockets to receive communication plugs connected to communication systems. The sockets may be connected to the same type of communication system or different types of communication systems. For example, one socket may be configured to receive a standard RJ-11 telephone jack, another socket may be configured to receive a standard RJ-45 plug, yet another socket may comprise a multiple pin interface and still another socket may be a USB.

A further aspect of the adaptor module is it may include an antenna for wireless communication. The antenna, for example, may be configured for cellular telephone communication, digital telephone communication, wireless LANs, radio communication, etc. Advantageously, the antenna may be used in combination with any type of sockets or connectors. Thus, the adaptor module may be configured to provide both wireless and wired communication.

Another aspect is the body of the adaptor module may provide additional support for the antenna and the antenna support structure. The body may contain a recess or depression to hold the antenna when it is not in use and a latch to secure the antenna in a storage position. Additionally, the module body may contain circuitry used by the antenna such as a radio frequency (RF) adaptor or circuit board. Further, the antenna is preferably a minimum size and configured to be used with any desired wireless system.

Another aspect of the adaptor module is it may include one or more indicators such as incandescent lights or light emitting diodes (LED). The indicators may provide various information such as indicating use of the adaptor module and/or mode of operation of the adaptor module. The indicator may also be used for other purposes such as installation and repair of the adaptor module.

Advantageously, the adaptor module may be connected to a PC card during the last steps or stages of the manufacturing process. Thus, the manufacturing of a device can be substantially completed and then the adaptor module with the desired configuration may be attached to the device. This increases the flexibility and options available to the manufacturer because, for example, the decision of which communication systems the device may be connected is delayed until late in the manufacturing process. Additionally, because the adaptor modules are interchangeable, the manufacturer may readily modify the device to be compatible with different communication systems.

In a preferred embodiment of the present invention, the adaptor module is an apparatus which facilitates communication between an electrical device and a communication system. The apparatus includes a communication card having a generally rectangular body with an upper surface, lower surface, front surface, rear surface, left surface and right surface, the communication card is configured to be at least partially inserted into an opening in the electrical device; a communications port is connected to the communication card; an adaptor is releasably connectable to the communications port of the communication card, the adaptor including at least one socket capable of receiving a connector coupled to a communication system; and an extension is attached to the adaptor and configured to be inserted into the communication port to establish electrical communication between the adaptor and the communication card. The adaptor also includes an outwardly extending slide rail and the communication port includes a groove. The slide rail is inserted into the groove to facilitate sliding attachment of the adaptor to the communication card.

The apparatus may also include one or more RJ-type connectors attached to the adaptor. Additionally, an input/output connector can be attached to the communication card and an auxiliary connector can be attached to the adaptor. The auxiliary connector is preferably configured to be electrically coupled to the input/output connector. Further, at least two sockets are desirably attached to the adaptor assembly and the sockets are configured to receive different types of communication connectors. For example, one of the sockets may receive an RJ-11 type communication connector and another socket may receive an RJ-45 type communication connector. Finally, the apparatus may include an antenna and/or an indicator attached to the adaptor.

In another preferred embodiment, the present invention includes an adaptor module configured to be in electrical communication with a communication card of a portable electric device. The adaptor module includes a generally rectangular body portion including top, front, bottom, rear and side surfaces; an elongated extension extending from the rear surface of the body and the extension being configured to be placed proximate the communication card; at least two recesses located in the front surface of the rectangular body, each of the recesses being configured to receive a communications connector; and an antenna attached to the body portion to establish wireless communication. The adaptor module desirably include an indicator attached to the body portion to provide information toauser.

In still another preferred embodiment, an interface between a communications connector and a communications card for an electrical device includes a generally rectangular body portion including top, front, bottom, rear and side surfaces; a plurality of sockets positioned in the front surface of the body portion, each of the sockets configured to receive a communications connector; and an elongated extension extending from the rear surface of the body, the extension configured to be inserted into a communications port of the communications card. The interface may also include an auxiliary input/output connector configured to be electrically connected to an input/output connector of a communications card. Additionally, the interface may include an antenna to allow wireless communication. Preferably, the interface is configured to be releasably attached to a communications card. Further, the interface is preferably configured to be attached to a communications card, and the interface and the communications card are configured to fit in a type III PCMCIA slot.

In still another preferred embodiment, an electrical coupling system for use with a media plug includes an adaptor including one or more sockets, each of the sockets configured to be releasably coupled to a media plug; a communications card including a communication port, the adaptor being connected to the communication port to allow electrical communication between the adaptor and the card; and means for effecting electrical communication between the media plug and the communication card when the media plug is attached to the communication card.

In yet another preferred embodiment, the present invention is an adaptor module for electrical connection to a communication card having a communication port. The adaptor module includes a body having an extension configured to be inserted into the communication port of the communication card to establish an electrical connection between he adaptor module and the communication card; a slide rail is attach to an outer surface of the extension, the slide rail is configured to be received in a frame track of the communication card to facilitate attachment of the adaptor module to the communication card; and one or more connectors in the body allow electrical connection to one or more communication connectors to the adaptor. The extension is preferably readily insertable and removable from the communication port of the communication card. Additionally, at least one of the recesses is preferably configured to receive an RJ-11 type communication connector and at least one of the recesses is configured to receive an RJ-45 type communication connector.

Advantageously, the adaptor module is reliable and provides increased convenience, flexibility and a variety of options to the user and/or manufacturer. In addition, the adaptor module is easy to use and provides an interface which can be quickly and easily connected to a variety of communication systems. Further, the adaptor module is compatible with a wide variety of computers, operating systems, etc.

Further aspects, features and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other aspects, features and advantages of the invention are obtained, a more particular description of the invention briefly described above will be rendered by reference to specific embodiments thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention involves an adaptor module for establishing communication between a communication system and a computer. The principles of the present invention, however, are not limited to adaptor modules for computers. It will be understood that, in light of the present disclosure, the adaptor module disclosed herein can be successfully used in connection with other types of electronic devices such as cellular telephones, digital telephones, personal data assistants, personal information managers and the like.

Additionally, to assist in the description of the adaptor module, words such as top, bottom, front, rear, right and left are used to describe the accompanying figures. It will be appreciated, however, that the present invention can be located in a variety of desired positions—including various angles, sideways and even upside down.

Further, it will be understood that in the following description numerous details are set forth, such as specific types of communication connectors or plugs, specific numbers of pins and electrical contacts, types of applications, etc., to provide a thorough understanding of the present invention. One skilled in the art will recognize, however, that the adaptor module may be used in conjunction with various communication systems, electrical devices and a wide variety of suitable connectors, plugs, contacts, and other structures or devices.

Figure 1:
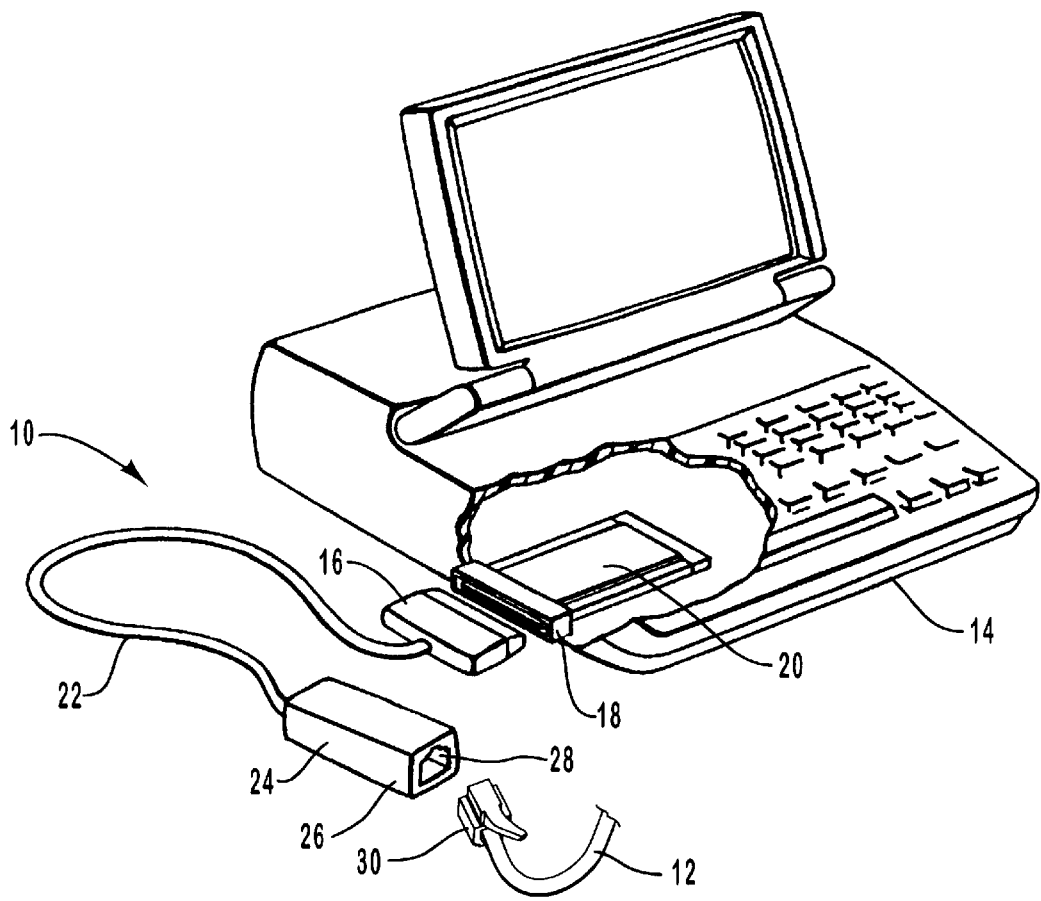
FIG. 1 is a perspective view of a known PCMCIA modem card connector arrangement.
Figure 2:
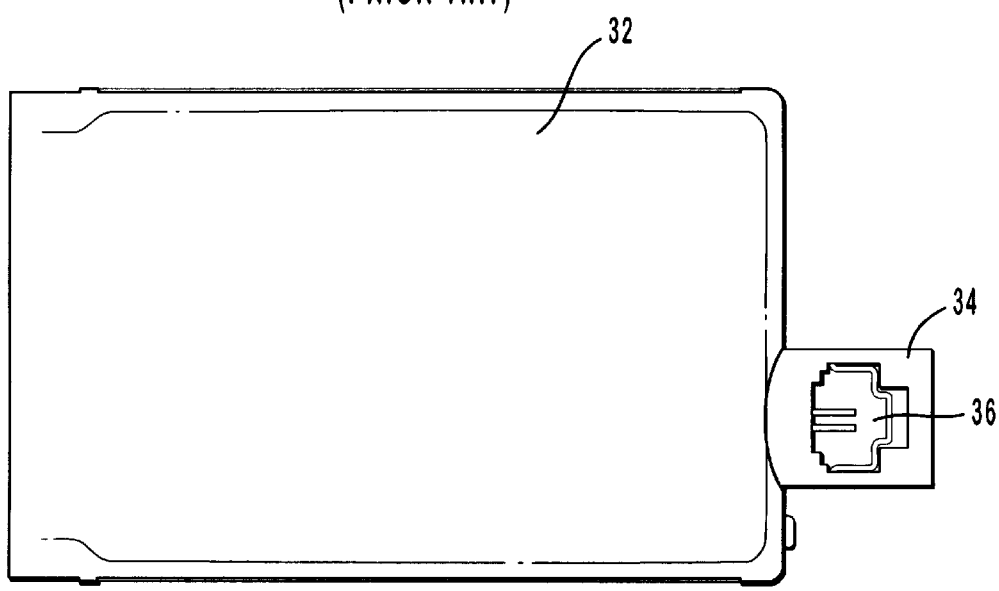
FIG. 2 is a top view of another known PCMCIA modem card arrangement.
Figure 3:
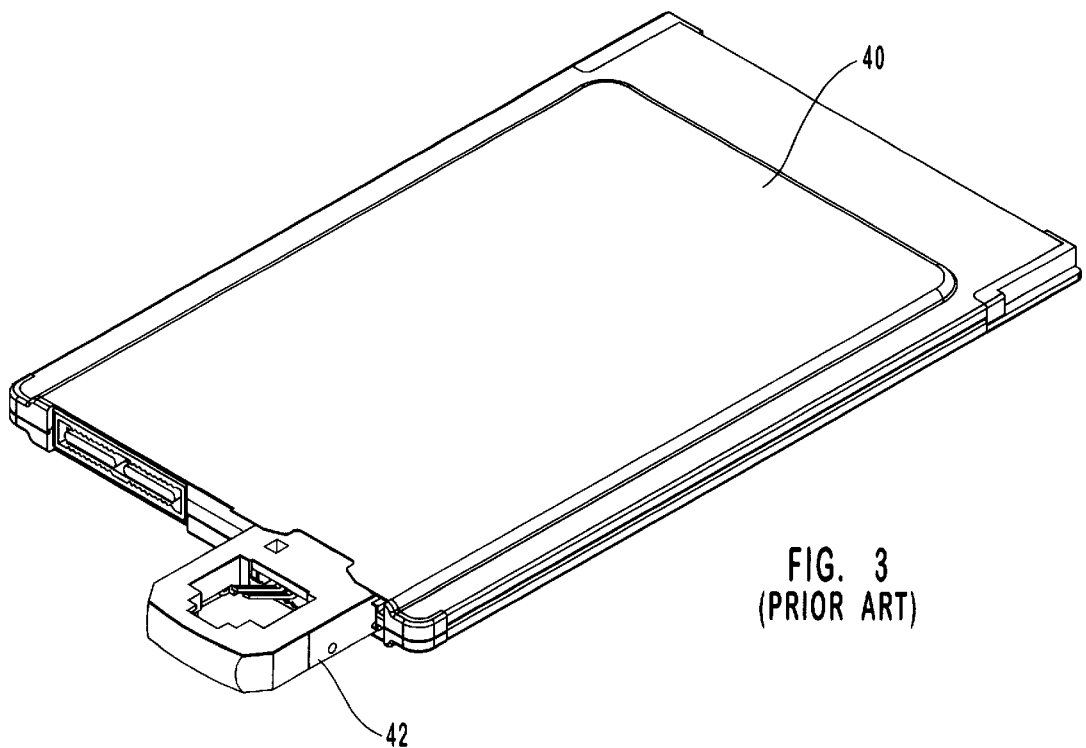
FIG. 3 is a perspective view of still another known PCMCIA modem card connector arrangement.
Figure 4:
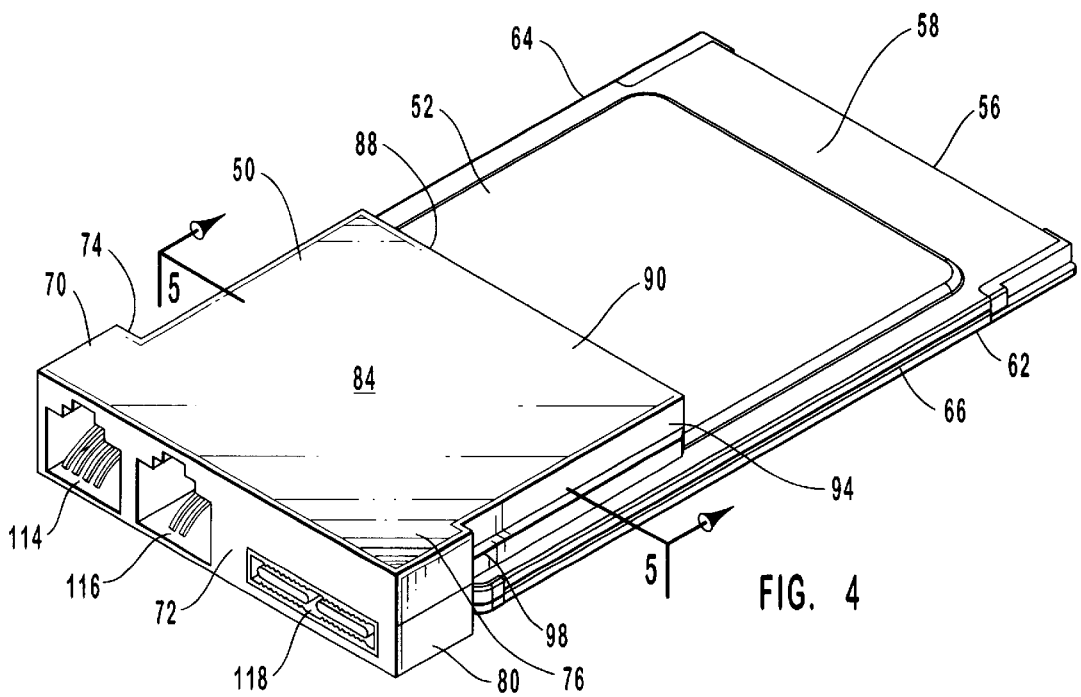
FIG. 4 is a perspective view of an adaptor module in accordance with a preferred embodiment of the present invention.

FIG. 4 illustrates a adaptor module 50 which is configured to be attached to a communications card 52 in accordance with a preferred embodiment of the present invention. The communications card 52 is sized and configured to be connected to a portable computer such as a laptop computer, notebook computer, hand-held computer or palmtop computer, but it can be used with any suitable computer or electronic devices such as cellular telephones, digital communication systems, personal data assistants and the like. Preferably, the communications card 52 complies with applicable Personal Computer Memory Card International Association (PCMCIA) standards. The PCMCIA standards, for example, are described in detail in the PCMCIA Specification Standard Release 2.1, which is hereby incorporated by reference. The PCMCIA specification, for example, provides standards for data storage and peripheral expansion cards. Additionally, the PCMCIA specification provides standards for input/output (I/O) capability for a standard bus extension slot so that peripherals such as modems and LAN adapters can use the bus. It will be understood, however, that while the adaptor module 50 is described with respect to PCMCIA standards, the adaptor module may be used with other types of circuit cards and adaptor cards. Additionally, while these cards are preferably a miniature type, any suitable size and type of card may be used.

The communications card 52, also referred to as a PC card or simply a card, includes a thin, elongated body with a front surface 54, rear surface 56, top surface 58, bottom surface 60, right side 62 and left side 64. The card is inserted into a PCMCIA slot in a computer and it includes a connector (not shown) at the rear of the card which is electrically connected to the computer. As described below, the front surface 54 of the card includes one or more sockets or connectors which can be coupled to the adaptor module 50. Located within the body of the card 52 is circuitry which connects the sockets at the front of the card with the connector at the rear of the card. The circuitry allows the intended function of the card to be performed, such as desired modem functions. The right side 62 and left side 64 of the card 52 include outwardly extending rails 66 and 68, respectively. These rails 66 and 68, as discussed below, are used to position the card 52 in a PCMCIA slot.

Figure 7:
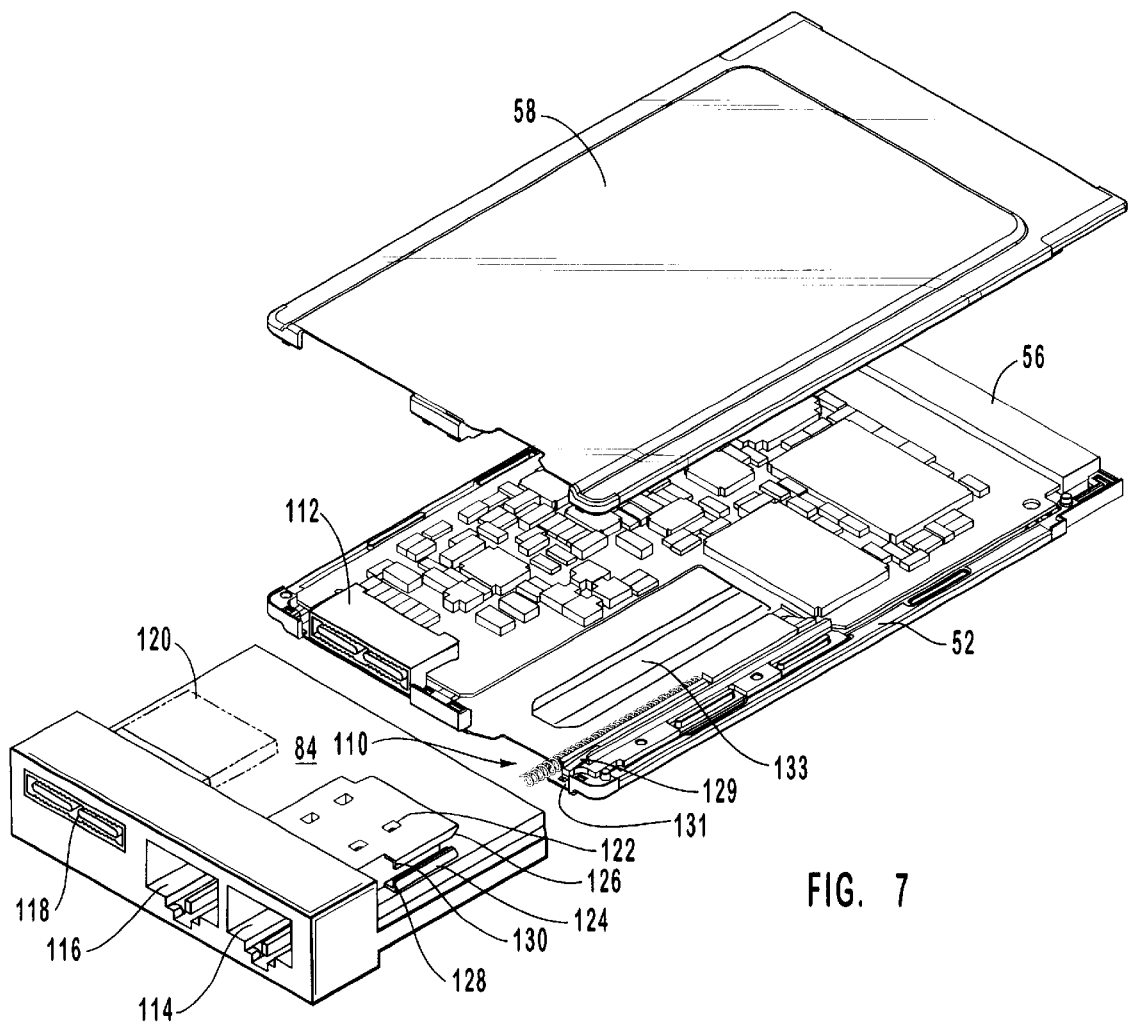
FIG. 7 is an exploded perspective view of an adaptor module in accordance with another preferred embodiment of the present invention.

The adaptor module 50 generally includes a body 70 with a front surface 72, rear surface 74, top surface 76, bottom surface 78, right side 80 and left side 82. The body 70 preferably has a height between about 1 inch and about ⅛ of an inch and, more preferably, between about ¼ of an inch and about ½ of an inch. The body 70 similarly has a depth or thickness preferably between about 1 inch and about ⅛ of an inch and, more preferably, between about ¼ of an inch and about ½ of an inch. One skilled in the art will appreciate that the module 50 may have any desired dimensions depending, for example, upon the intended use and configuration of the module. Extending from the rear surface 74 of the body 70 is an extension 84 with a front surface, rear surface 88, top surface 90, bottom surface 92, right side 94 and left side 96. The body 70 and the extension 84 are integrally formed as a single unit, but the body and the extension could also be separate components. The extension 84 has the same general shape and configuration as the card 52 and, as shown in FIG. 4, the extension is placed with its bottom surface 92 proximate and generally parallel to the top surface 58 of the card. It will be understood that the top surface 90 of the extension 84 could also be positioned proximate the bottom surface 60 of the card 52, as shown in FIG. 7.

Figure 5:
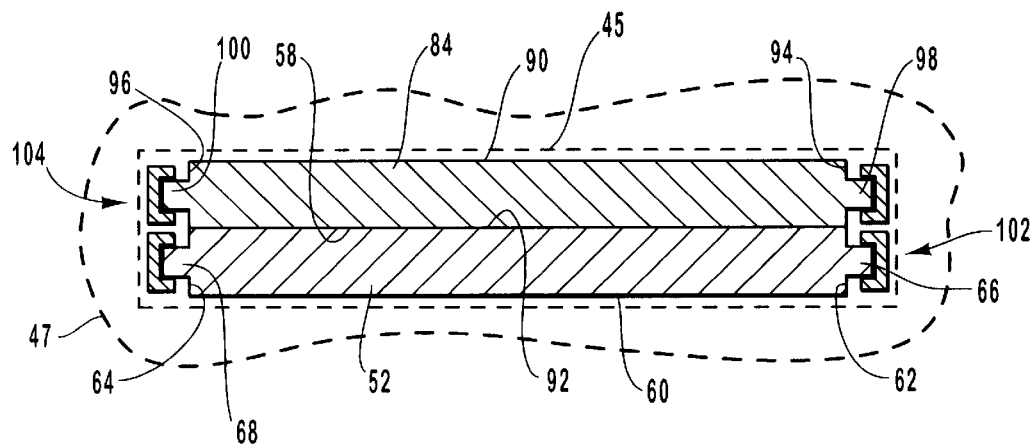
FIG. 5 is a cross sectional side view along lines 5—5 of the adaptor module shown in FIG. 4.

Desirably, the adaptor module 50 is sized and configured to allow the card 52 and the extension 84 to be inserted into adjacent PCMCIA slots such as is denoted schematically by way of the dashed lines designated at 45 in FIG. 5. In particular, the extension 84 and the card 52 are preferably inserted into two stacked type II PCMCIA slots or a type III PCMCIA slot. The PCMCIA slots may be recessed into the body of the computer (or any other electrical device denoted schematically by way of the dashed lines designated at 47 in FIG. 5) such that the adaptor module 50 is also recessed into the body. Alternatively, the slots may be positioned such that the front surface 72 of the body 70 is generally aligned with the exterior surface of the computer. Additionally, the slots may be positioned such that a portion of the module 50 extends outwardly from the body of the computer. Advantageously, for example, if the adaptor module 50 protrudes from the exterior surface of the computer, that may facilitate removing and interchanging of the modules. On the other hand, if the face of the adaptor module 50 is flush with the exterior surface of the computer, that may prevent damage or accidental contact with the module.

Outwardly extending from the right side 94 and the left side 96 of the extension 84 are rails 98 and 100, respectively.

The rails 66 and 68 of the card 52 and the rails 98 and 100 of the extension 84 are configured to securely hold the card and the adaptor module 50 in the adjacent PCMCIA slots. As shown in FIG. 5, the PCMCIA slots include receiving members 102 and 104 that are configured to receive the outwardly extending rails 66, 68, 98 and 100 respectively. In detail, the receiving members 102 and 104 have a generally C-shaped cross-section which is sized and configured to slidably receive the rails 66, 68, 98 and 100. Thus, the card 52 and the adaptor module 50 can readily be inserted into the PCMCIA slots and the receiving members 102 and 104 securely hold the card and adaptor module in the desired position.

Figure 6:
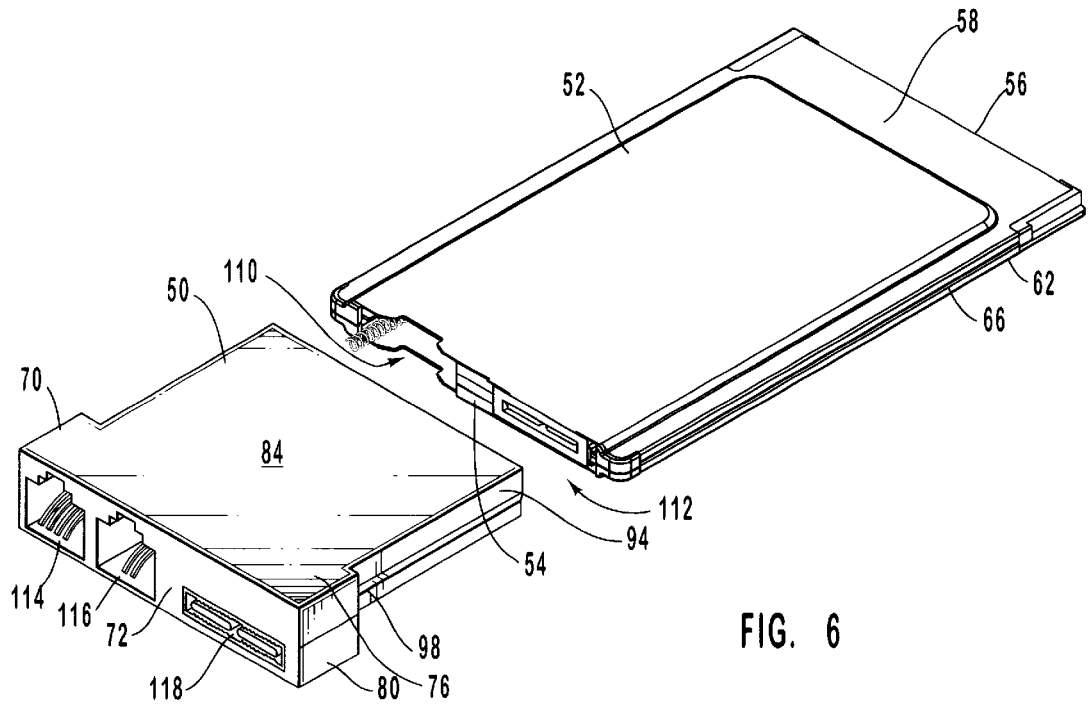
FIG. 6 is an exploded perspective view of the adaptor module shown in FIG. 4, illustrating the adaptor module and communications card.

As seen in FIG. 6, the adaptor module 50 is releasably attached to the card 52. Advantageously, this allows different adaptor modules 50 with different configurations to be readily attached to the card 52. Additionally, because the adaptor module 50 is releasably attached to the card 52, the module can be quickly and easily removed for repair or replacement. Alternatively, the adaptor module 50 and the card 52 can be integrally constructed as a single unit.

The front surface 54 of the communication card 52 includes an opening 110 and an interface 112. The interface 112 allows electrical communication with the card 52 to be established. The interface 112 is preferably a multiple pin interface with any number of desired pins such as 15, 26 or 34. The interface 112 could also be a Universal Serial Bus (USB) that allows various peripheral devices to be connected to the card 52.

The opening 110 also allows electrical communication with the card to be established. The opening 110, for example, may have a generally similar electrical interface and structural configuration as disclosed in Assignee's co-pending U.S. patent application Ser. No. 09/271,620, entitled Electrical Connectors Having Dual Based Contact Pins, filed Mar. 17, 1999, listing Oliphant et al. as the inventors, which is hereby incorporated by reference in its entirety. The opening 110, for example, may also include an electrical interface and configuration as disclosed in Assignee's co-pending U.S. patent application Ser. No. 08/976,199, entitled Breakaway Physical/electrical Media Jack, filed Nov. 21, 1997, listing Garside as the inventor now U.S. Pat. No. 5,971,777; or Assignee's co-pending U.S. patent application Ser. No. 08/976,819, entitled Media Connector Interface for Electrical Apparatus, filed Nov. 24, 1997, listing Beckham, et al. as the inventors now abandoned. These applications are hereby incorporated by reference in their entirety.

The front surface 72 of the body 70 of the adaptor module 50 includes one or more sockets or connecting portions. For example, the adaptor module 50 may include one or more RJ-type connectors, USBs and/or multiple pin interfaces. As shown in FIG. 6, the adaptor 50 includes a first RJ-type connector 114, a second RJ-type connector 116 and an auxiliary connector 118. The RJ-type connectors may be, for example, RJ-11 or RJ-45 connectors for connection to telephone lines or LANs, but any type of connector may be used. The auxiliary connector 118 may comprise a multiple pin interface, a pass-through connector, USB or other electrical connector. The connectors 114, 116 and 118 are configured to interface with any desired communication system and the adaptor 50 may include any number or combination of connectors.

Computer circuitry such as a printed circuit board (PCB) is located within the housing of the adaptor module 50 so that the desired function can be performed. The circuitry, for example, may be positioned in the body 70 and/or the extension 84 of the adaptor module 50. This circuitry can be used with various equipment such as modems, interfaces and antennas, which are discussed in more detail below, and to support various functions such as Direct Access Arrangement (DAA) for Asymmetric Digital Subscriber Lines (ADSL), G.Lite and/or a cable modem adaption interface. One skilled in the art will recognize the circuitry can be used in many different applications to perform many different functions.

Additionally, the arrangement and positioning of the various components of the adaptor 50 and card 52 may be changed. For example, the adaptor module 50 and card 52 are shown in a first arrangement in FIG. 5 and in a second arrangement in FIG. 7. Thus, it will be appreciated by one skilled in the art that the adaptor 50 and card 52 may have any desired order or arrangement.

As shown in FIG. 7, the auxiliary connector 118 includes a first extension 120 that is configured to be inserted and connected to the interface 112 of the card 52. The first extension 120 allows electrical communication between the connector 118 and the card 52 to be established. The connectors 114 and 116 are connected to a second extension 122 that is inserted into the opening 110 in the card 52. The second extension 122, which is in electrical communication with the connectors 114 and 116, includes a first slide rail 124, a second slide rail 126, a first locking edge 128 and a second locking edge 130 all of which are shown in further detail in the exploded view of FIG. 7A.

Figure 7A:
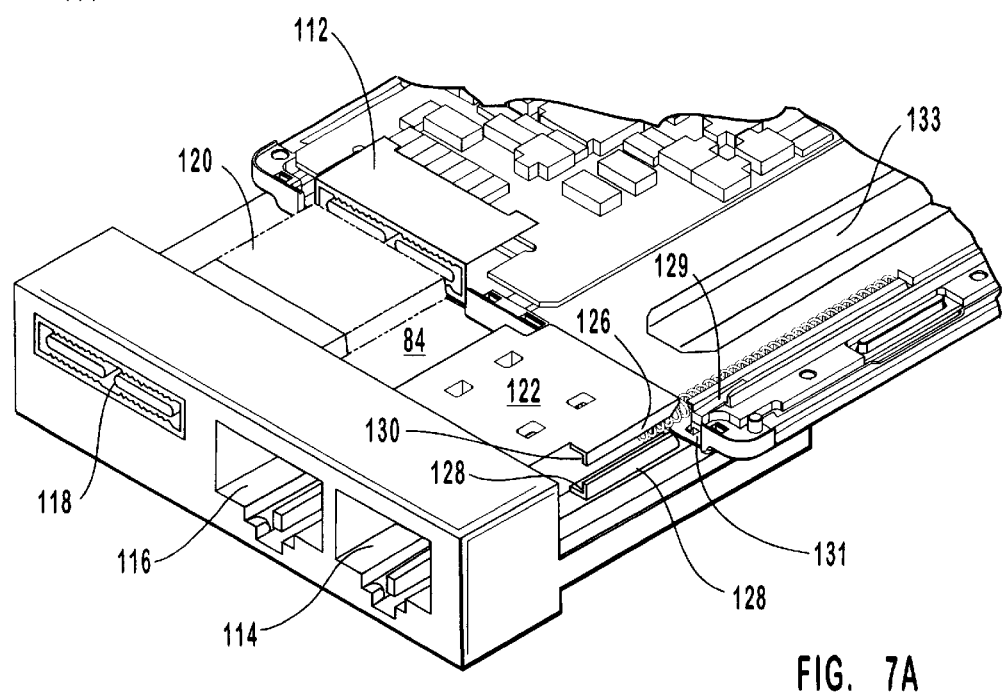
FIG. 7A is an exploded perspective view illustrating in greater detail aspects of the adaptor module of FIG. 7.

The second extension 122 is preferably inserted into an input/output (I/O) port of the card 52. More preferably, the extension 122 is slidably connected to a slidable connector that is configured to receive a physical/electrical media connector, such as an XJACK® connector available from the 3Com Corporation. Advantageously, because the adaptor module 50 can be used with an XJACK® slidable connector, it can be used in a wide variety of circumstances and situations. Exemplary slidable connectors are disclosed in Assignee's co-pending U.S. patent application Ser. Nos. 09/271,620; 08/976,199 and 08/976,819, which were previously incorporated by reference in their entirety. Another example of a slidable connector is disclosed in Assignee's co-pending U.S. patent application Ser. No. 09/033,270, filed Mar. 2, 1998, which is hereby incorporated by reference in its entirety. For example, as shown in FIGS. 7 and 7A, the rails 126 and 128 are received by correspondingly shaped and sized tracks or grooves, such as is shown at track/groove 129 (for receiving rail 126) and track/groove 131 (for receiving rail 128). Thus, when inserted into the opening 110, the rails 126 and 128 are received on the corresponding track/grooves 129, 131 so as to provide an aligned and supported physical interface between the adaptor module 50 and card 52. Moreover, in the embodiment of FIG. 7, when received within the opening 110, the elongate finger section 133 projecting from the printed circuit board in the form of an edge connector is operatively and electrically connected to the connectors 114 and 116, for example in the manner described in co-pending application Ser. No. 09/271,620, previously incorporated herein by reference. Thus, electrical communication between the adaptor module 50 and the card 52 is established when the extension 122 is inserted into the opening 110 in the card 52. While the adaptor module 50 and card 52 are preferably separate, readily interchangeable components, the module and card may also be integrally formed or securely attached. Further, one skilled in the art will appreciate there are various known ways to electrically connect the adaptor module 50 and card 52.

Figure 8:
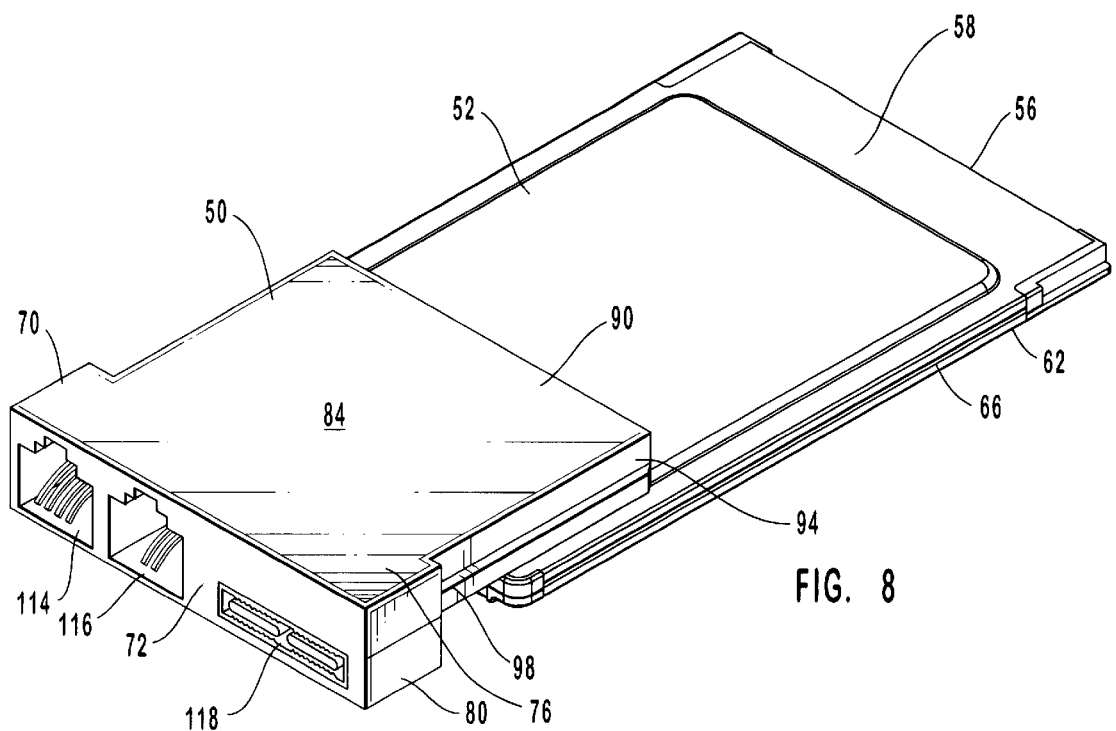
FIG. 8 is a perspective view of an adaptor module in accordance with yet another preferred embodiment of the present invention, illustrating the adaptor module extending outwardly from the PC card.

FIG. 8 illustrates another preferred embodiment of the adaptor module 50 wherein the module extends outwardly from the card 52. This allows the module 50 to be attached to PCMCIA slots that are recessed into the computer. Advantageously, this allows the front surface 72 of the module to be positioned flush with the exterior surface of the computer. Alternatively, this embodiment allows the body 70 of the module 50 to extend further outwardly from the body of the computer.

Figure 9:
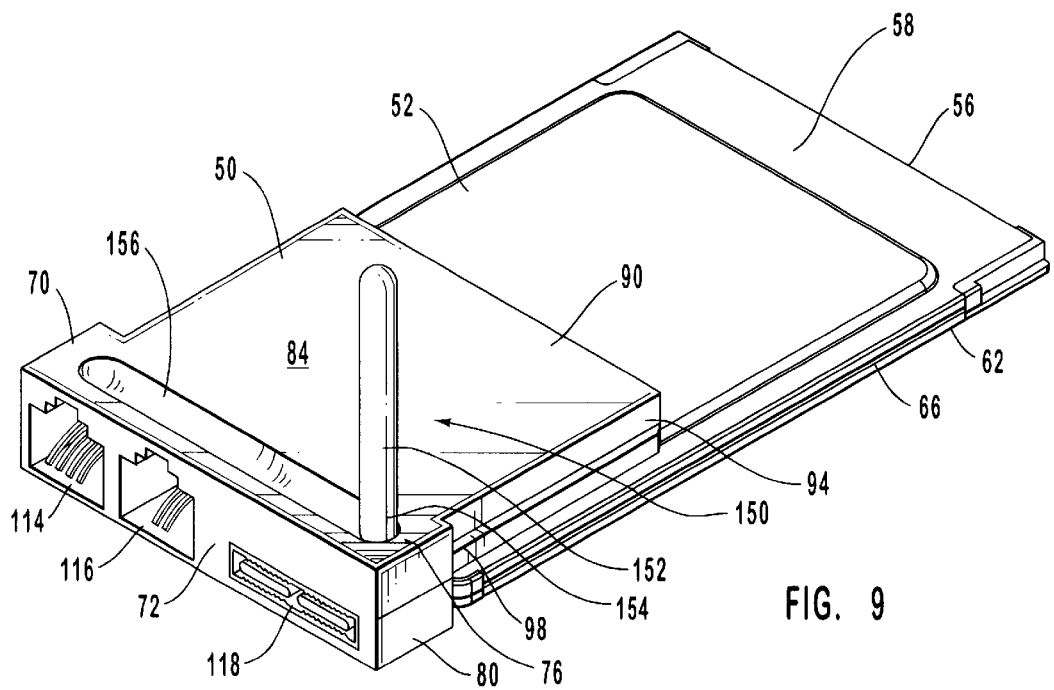
FIG. 9 is perspective view of an adaptor module in accordance with still another preferred embodiment of the present invention, illustrating an antenna attached to the adaptor module.

As seen in FIG. 9, in another preferred embodiment, the adaptor module 50 includes an antenna system 150 attached to the body 70 of the module. The antenna system 150 is configured to be in communication with a wireless communications network. The wireless communications network, for example, may include wireless modems, wireless LAN, wireless PAN, cellular telephone networks, digital communication systems, etc. The wireless communication network may also include Bluetooth technology which allows a wide range of computing and telecommunication devices to be interconnected via wireless connections. Specifications and other information regarding Bluetooth technology are available at the Bluetooth Internet site www.bluetooth.com. Additionally, specifications and other information regarding Bluetooth technology will be published in the Bluetooth Special Interest Group (SIG) Version 1.0.

The antenna system 150 includes a monopole antenna 152, but any suitable type of antenna, such as dipole or slotted antenna, may also be used depending upon factors such as desired polarization and radiation patterns. Additionally, while the antenna system 150 may be used with any suitable wireless communication system, the antenna system is preferably configured to conform with applicable Bluetooth technology specifications and standards. For example, in accordance with the proposed Bluetooth standards, the antenna 152 is configured to use the Industrial Scientific and Medical (ISM) frequency band of 2.4 to 2.4835 gigahertz (GHz). One skilled in the art, however, will appreciate that the antenna 152 can be used with any suitable band or frequency depending, for example, upon the intended use of the antenna system 150.

In greater detail, the antenna 152 includes a radiating element (not shown in the accompanying figures) which is constructed of a flexible, metallic material that permits repeated bending or flexing of the antenna. In particular, the material has a modules of elasticity which allows the radiating element to be readily bent or flexed into the desired position. The radiating element also has an elastic limit and fatigue limit which allows the radiating element to be repeatedly moved and positioned in the desired manner. The radiating element is preferably constructed of spring steel having the desired characteristics, but it may be constructed from other suitable materials such as copper or bronze. The radiating element is preferably plated with a conductive material such as copper and the plating desirably has a thickness of at least about 0.0003 inches, but the plating may be thicker or thinner and other suitable conductive material may be used.

The antenna 152 also includes a protective sheath or covering 154 which substantially encloses the radiating element. The sheath 154 is constructed of a flexible, elastic material which allows the radiating element to bend or deflect into the desired configuration. In particular, the sheath 154 is molded around the radiating element in such a manner that the section modulus is considerably reduced to allow the radiating element to be bent from the generally straight position to the angled position without exceeding the elastic limit of the material. The body 70 of the module 50 includes a recess or depression 156 to hold the antenna 152 when it is not in use and a latch (not shown) may be used to secure the antenna in a storage position. Additionally, the housing of the module 50 may contain support structure and various circuitry for the antenna, such as a radio frequency (RF) adaptor or circuit board. While the antenna 152 is preferably a minimum size and configured to be used with any desired wireless system, the antenna can have any size and configuration depending, for example, upon the desired use of the antenna system 150.

An exemplary antenna system 150 which may be used in conjunction with the adaptor module 50 is disclosed in Assignee's co-pending U.S. patent application Ser. No. 09/322,870, filed herewith, entitled Antenna for Portable Computers, listing Madsen et al. as inventors, and this application is hereby incorporated by reference in its entirety. One skilled in the art will understand that other antennas and wireless communication systems may also be used with the adaptor module 50 of the present invention.

Figure 10:
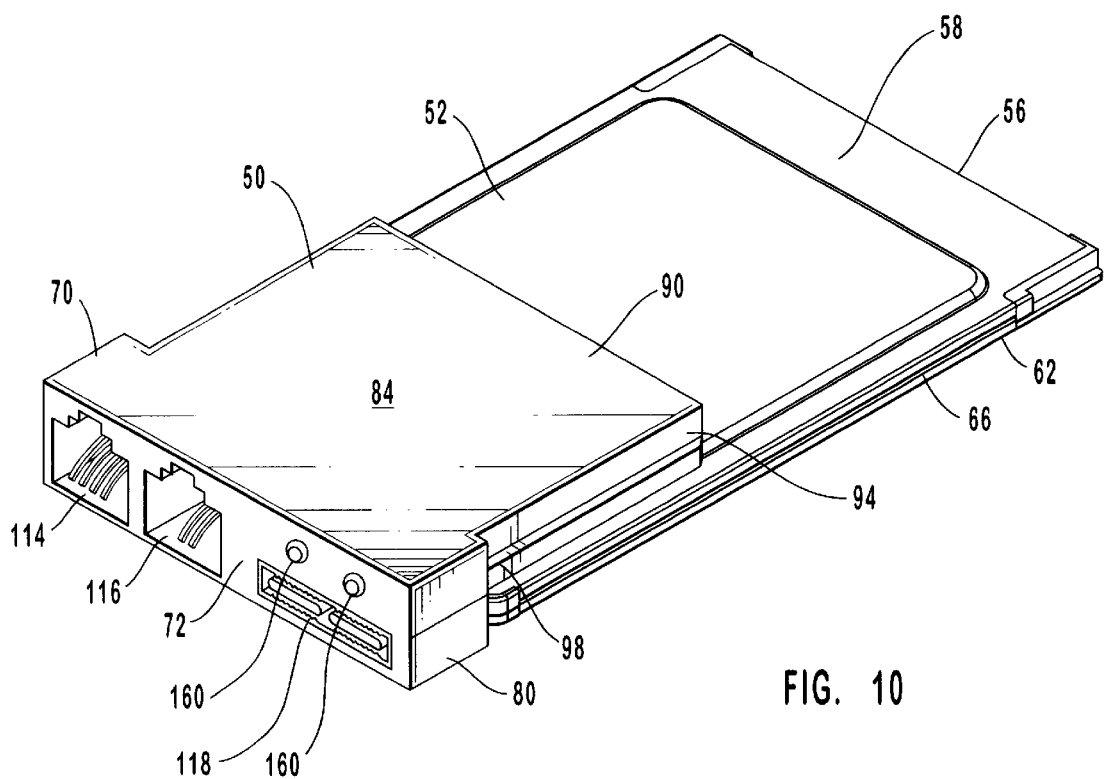
FIG. 10 is perspective view of an adaptor module in accordance with a further embodiment of the present invention, illustrating indicators attached to a front surface of the adaptor module.

As seen in FIG. 10, the adaptor module 50 may include one or more indicators 160 to provide information to the user. The indicators 160 are preferably light sources such as incandescent lights or light emitting diodes (LEDs). The indicators 160 may provide various information such as use of the adaptor module 50 and/or the mode of operation of the adaptor module. The indicators 160 may also be used for other purposes such as set-up and installation, or diagnostics and repair of the adaptor module 50. The indicators 160, for example, may be electrically connected to the circuitry located within the body of the module 50 or electrically connected to the card 52.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An apparatus which facilitates communication between an electrical device and a communication system, said apparatus comprising:

a communication card having a generally rectangular body with an upper surface, lower surface, front surface, rear surface, left surface and right surface, said communication card being configured to be at least partially inserted into an opening in the electrical device;

a communications port connected to said communication card;

an adaptor comprising:

at least one socket capable of receiving a connector coupled to a communication system; and an extension interface configured to electrically and physically interface with the communication port to establish electrical communication between the at least one socket and said communication card, said extension interface including at least one rail that is capable of being operatively received by a corresponding groove formed in the communications port so as to provide physical attachment between the adapter and the communication card.

2. The apparatus of claim 1, wherein the at least one socket is comprised of one or more RJ-type connectors.

3. The apparatus of claim 1, further comprising an input/output connector attached to said communication card and an auxiliary connector attached to said adaptor, said auxiliary connector configured to be electrically coupled to said input/output connector.

4. The apparatus of claim 1, further comprising at least two sockets attached to said adaptor assembly and wherein said sockets are configured to receive different types of communication connectors.

5. The apparatus of claim 4, wherein one of said sockets is configured to receive an RJ-11 type communication connector and another of said sockets is configured to receive an RJ-45 type communication connector.

6. The apparatus of claim 1, further comprising an antenna attached to said adaptor and configured for wireless communication.

7. The apparatus of claim 1, wherein said communication card is configured to be inserted into an opening in the electrical device and said adaptor is configured to be partially inserted into said opening in the electrical device.

8. The apparatus of claim 1, wherein said adaptor is releasably attached to said communication card and said adaptor is readily interchangeable with other adapters.

9. The apparatus of claim 1, wherein said adaptor allows said communication card to be simultaneously connected to at least two different communication connectors.

10. The apparatus of claim 1, further comprising an indicator attached to said adaptor for providing information to a user.

11. An adapter module configured to be in electrical communication with a communication card of a portable electric device, said adaptor module comprising:
   a generally rectangular body portion including top, front, bottom, rear and side surfaces;
   an extention interface configured to electrically and physically interface with the communication card, the extention interface comprising at least one rail that is capable of being operatively received by a corresponding groove formed in a communication port of the communication card so as to provide physical attachment between the adapter module and the communication card, and wherein the extention interface electrically interfaces with connector formed on a printed circuit bord positioned within the communication card when the adaptert module is physically attached to the communication card; and
   an antenna attached to said body portion, said antenna configured to esterblish wireless communication.

12. An adaptor module as in claim 11, further comprising an indicator attached to said body portion for providing information to a user.

13. An interface between a communications connector and a communication card for an electrical devices; said interface comprising:
   a generally rectangular body portion including top, front, bottom, rear and side surfaces;
   a plurality of socket positioned in said front surface of said body portion, each of said sockets configured to receive a communication connector; and
   an elongated extention interface extenting from said rear surface of said body, said extention interface configured to establish electrical communication between the plurality of sockets and an edge connector on a printed circuit bord positioned within the communication card.

14. The interface of claim 13, further comprising an auxiliary input/output connector configured to be electrically connected to an input/output connector of a communications card.

15. The interface of claim 13, further comprising an antenna to allow wireless communication.

16. The interface of claim 13, wherein said interface is configured to be releasably attached to a communications card.

17. The interface of claim 13, wherein said interface is configured to be attached to a communications card; and wherein when said interface and communications card are attached to fit in a type III PCMCIA slot.

18. The interface of claim 13, wherein said interface is integrally connected to a communications card.

19. An electrical coupling system for use with a media plug, the coupling system comprising:
   an adaptor including one or more sockets, each of said sockets configured to be releasably coupled to a media plug;
   a communications card including a communication port, said adaptor being connected to said communication port to allow electrical communication between said adaptor and said card; and
   an edge connector formed on a printed circuit board that is disposed within the communication card, the edge connector oriented so as to be operatively received by the adapter in a manner so as to effect electrical communication between the media plug and the communication card when the media plug is attached to one of the sockets.

20. An adaptor module for electrical connection to a communication card having a communication port, said adaptor module comprising:
   a body having an extension configured to be inserted into the communication port of the communication card to establish a physical and an electrical connection between the adaptor module and the communication card, the electrical connection being provided via an elongate printed circuit board section that is capable of being electrically received within the extension;
   a slide rail attached to an outer surface of said extension, said slide rail configured to be received in a frame track of the communication card to facilitate attachment of the adaptor module to the communication card; and
   one or more connectors in said body to allow electrical connection to one or more communication connectors to said adaptor.

21. The adaptor module of claim 20, wherein said extension is readily insertable and removable from said communication port of the communication card.

22. The adaptor module of claim 20, wherein at least one of said recesses is configured to receive an RJ-11 type communication connector and wherein at least one of said recesses is configured to receive an RJ-45 type communication connector.

* * * * *